(12) United States Patent
Coronel et al.

(10) Patent No.: US 7,420,253 B2
(45) Date of Patent: Sep. 2, 2008

(54) THREE-GATE TRANSISTOR STRUCTURE

(75) Inventors: Philippe Coronel, Barraux (FR); Romain Wacquez, Grenoble (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 0 days.

(21) Appl. No.: 11/434,561

(22) Filed: May 15, 2006

(65) Prior Publication Data

US 2007/0018227 A1    Jan. 25, 2007

(30) Foreign Application Priority Data

May 16, 2005    (FR)    ................................. 05 04891

(51) Int. Cl.
*H01L 29/76* (2006.01)
(52) U.S. Cl. .................. 257/365; 257/314; 257/317; 257/321; 257/366; 257/401
(58) Field of Classification Search .............. 257/314, 257/317, 321, 365, 366, 401
See application file for complete search history.

(56) References Cited

U.S. PATENT DOCUMENTS

| | | | |
|---|---|---|---|
| 5,180,680 A * | 1/1993 | Yang ........................... 438/259 |
| 5,567,959 A | 10/1996 | Mineji | |
| 5,705,415 A * | 1/1998 | Orlowski et al. ............ 438/259 |
| 5,899,710 A * | 5/1999 | Mukai ......................... 438/156 |
| 6,413,802 B1 * | 7/2002 | Hu et al. ...................... 438/151 |
| 6,562,665 B1 | 5/2003 | Yu | |
| 7,154,118 B2 * | 12/2006 | Lindert et al. ................. 257/66 |
| 7,173,305 B2 * | 2/2007 | Yang et al. ................... 257/326 |
| 7,193,279 B2 * | 3/2007 | Doyle et al. ................. 257/401 |
| 2004/0145000 A1 | 7/2004 | An et al. | |
| 2004/0198003 A1 | 10/2004 | Yeo et al. | |
| 2005/0029583 A1 | 2/2005 | Popp et al. | |
| 2005/0285161 A1* | 12/2005 | Kang et al. .................. 257/288 |

* cited by examiner

*Primary Examiner*—Eugene Lee
(74) *Attorney, Agent, or Firm*—Lisa K. Jorgenson; Robert Iannucci; Seed IP Law Group PLLC

(57) ABSTRACT

A transistor structure comprises a semiconductor element extending between a source zone and a drain zone, as well as three portions of gates disposed on different sides of the semiconductor element. Such a structure is especially compact and may be used as two or three transistors having independent respective functions. In particular, the structure may be used as a combination of a transistor with a logic or analog function, with one or two random access memory cells.

24 Claims, 5 Drawing Sheets

THREE-GATE TRANSISTOR STRUCTURE

BACKGROUND OF THE INVENTION

1. Field of the Invention

Figure 1:
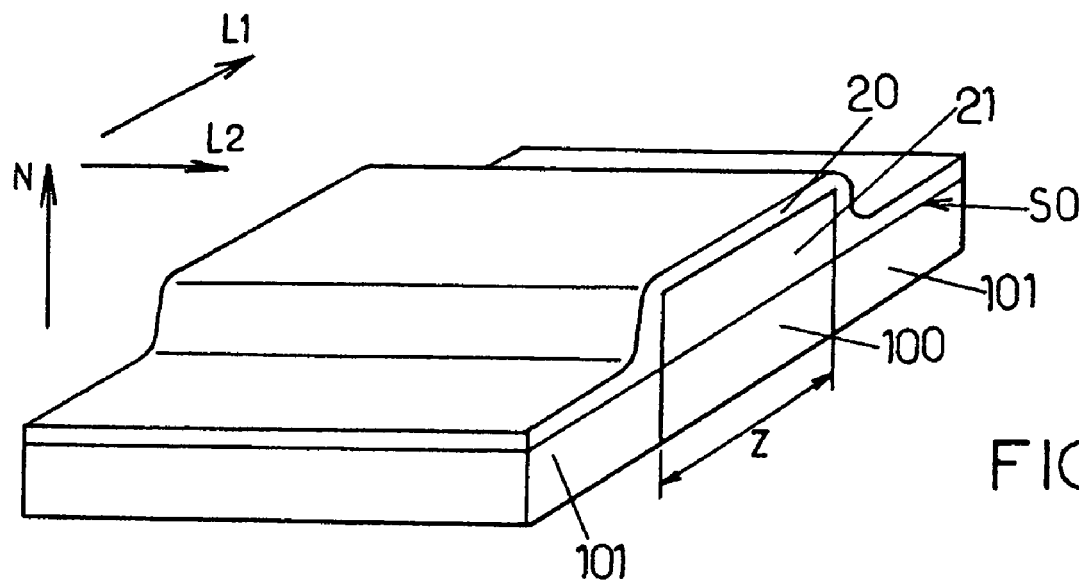

The present invention relates to a three-gate transistor structure, which may be used, in particular, to make random access memory cells. It also relates to a method of making a three-gate transistor structure.

2. Description of the Related Art

The search for ever higher levels of integration for integrated electronic circuits has led to the design of so-called three-dimensional component architectures. In a three-dimensional architecture, components, or parts of components, are overlaid in a direction perpendicular to the surface of a circuit substrate, instead of being juxtaposed side by side at the substrate surface level.

In particular, it is known to make MOS transistors (standing for metal-oxide-semiconductor) with surrounding gates, or MOS-GAA transistors (standing for "Gate All Around"), in which the gate surrounds a semiconductor element which extends between a source zone and a drain zone. In certain MOS-GM transistors, portions of the gate, respectively lower and upper, are disposed straddling the semiconductor element, in a direction perpendicular to the surface of a substrate of the circuit.

It is also known to make two random access nonvolatile memory cells by disposing two independent gates respectively above and below a single semiconductor element extending between a source zone and a drain zone. The two gates are situated above one and the same zone of the substrate, so that a high level of integration is obtained, as compared with two random access nonvolatile memory cells which are juxtaposed parallel to the surface of the substrate.

Nevertheless, in each case, the component or components or parts of components which are overlaid in a three-dimensional architecture accomplish an identical function, such as, for example, control of the conductivity of an MOS transistor or storage of bits.

BRIEF SUMMARY OF THE INVENTION

One embodiment of the present invention provides a three-dimensional architecture of an integrated electronic circuit, which is suitable for executing at least two different functions.

One embodiment of the invention proposes a transistor structure comprising:

a semiconductor element extending in a longitudinal direction between a source zone and a drain zone, the element comprising a first part and a second part each connecting the source and drain zones, the second part being connected to a side of the first part over a length between the source and drain zones;

a first gate portion situated on one side of the first part of the semiconductor element opposite the second part of the element;

a second gate portion and a third gate portions that are situated respectively on two opposite sides of the second part of the semiconductor element, in a direction perpendicular to the longitudinal direction; and a first, a second and a third electrical insulation layer, respectively situated between the semiconductor element and the first, second and third gate portions, respectively.

In such a structure, the semiconductor element is shared between the three gate portions, thus endowing the structure with a particularly high degree of compactness.

Furthermore, the disposition of the three gate portions around the semiconductor element constitutes a three-dimensional architecture. Specifically, if the longitudinal direction of the semiconductor element is parallel to the surface of a substrate carrying the structure, two gate portions are overlaid in the direction perpendicular to the surface of the substrate. If the longitudinal direction of the semiconductor element is perpendicular to the surface of the substrate, the architecture is still three-dimensional since the source and drain zones are then overlaid above the surface of the substrate. In all cases, the transistor structure therefore exhibits a very high level of integration.

Additionally, the three gate portions being electrically insulated from one another, they may be assigned different and independent functions within an electronic circuit which incorporates the transistor structure. For example, the second and third gate portions may be assigned a random access memory function, and the first gate portion may be assigned a logic or analog function.

Preferably, the second part of the semiconductor element is connected to the first part of this element in such a way that a transverse section of the element in a plane perpendicular to the longitudinal direction possesses a T shape. In this case, the second and third gate portions may have symmetric configurations, in particular with respect to the semiconductor element. They are then particularly suited for possessing identical functions within the electronic circuit which incorporates the transistor structure.

The second and third electrical insulation layers may each be made of an oxide material. In this case, the transistor structure may be used to make a random access memory element intended for storing a bit. For example, a suitable electrical potential may be applied to the second gate portion, so as to hold a space charge in the second part of the semiconductor element which then exhibits a floating potential, as a function of the value of the bit stored. The third gate portion then makes it possible to authorize the writing of a binary value into the cell, then to read this value by detecting a modification of the threshold voltage of the transistor formed by the source and drain zones on the one hand, and by the third gate portion on the other hand. Such a random access memory cell is volatile, since the electric charge contained in the second part of the semiconductor element disappears if the electrical potential applied to the second gate portion is removed.

Alternatively, the second and third electrical insulation layers each comprise a stack of three elementary layers, each stack comprising an elementary layer of a nitride material situated between two elementary layers of oxide materials. The transistor structure may then be used to make a random access memory cell intended for storing two bits. Specifically, electrical charges may be contained in each of the second and third insulating layers, which correspond to two independent binary values. In this case, the source and drain zones constitute, together with the second gate portion, a first nonvolatile, or permanent, random access memory cell. They simultaneously constitute, together with the third gate portion, a second random access memory cell which is identical to the first cell, but independent of the latter.

The invention also proposes a method of making a transistor structure of the above type. Such a method comprises the following steps:

(a) forming a first semiconductor portion above the surface of an integrated electronic circuit substrate, a second semiconductor portion being situated between the substrate and the first semiconductor portion in a middle zone of the latter;

(b) exposing two lateral faces of the second semiconductor portion, that are situated on two opposite sides of the latter;

(c) partially etching the second semiconductor portion starting from the exposed lateral faces, leaving a central part of the second semiconductor portion narrower than the first semiconductor portion in the middle zone of the latter;

(d) forming two lower portions of electrically insulating layer, respectively in two cavities produced by the etching of the second semiconductor portion on the two lateral faces;

(e) forming two electrically conducting lower portions, respectively against the two lower portions of insulating layer;

(f) forming an upper portion of electrically insulating layer, on a face of the first semiconductor portion opposite the second semiconductor portion; and (g) forming an electrically conducting upper portion, on the upper insulating layer.

Such a method borrows at least in part some of the steps for making a MOS-GAA transistor, in particular steps (a)-(d). Such steps are therefore well mastered and make it possible to obtain high fabrication yields. In contradistinction to the making of a MOS-GAA transistor, the etching step (c) is stopped before an emergent tunnel is formed between the substrate and the first semiconductor portion.

According to a preferred mode of implementation of a method according to the invention, the first semiconductor portion and second semiconductor portion are formed respectively from distinct first and second semiconductor materials. The second semiconductor portion is then etched in step (c) by using a method of selective etching of the second semiconductor material with respect to the first semiconductor material. By virtue of the use of two different materials for the first and second semiconductor portions, the second semiconductor portion may be etched without it being necessary to protect the first semiconductor portion. The method is then simple and short, in particular since layers or masks intended to protect the first semiconductor portion during the etching of the second semiconductor portion are unnecessary.

BRIEF DESCRIPTION OF THE SEVERAL VIEWS OF THE DRAWING(S)

Figure 9:
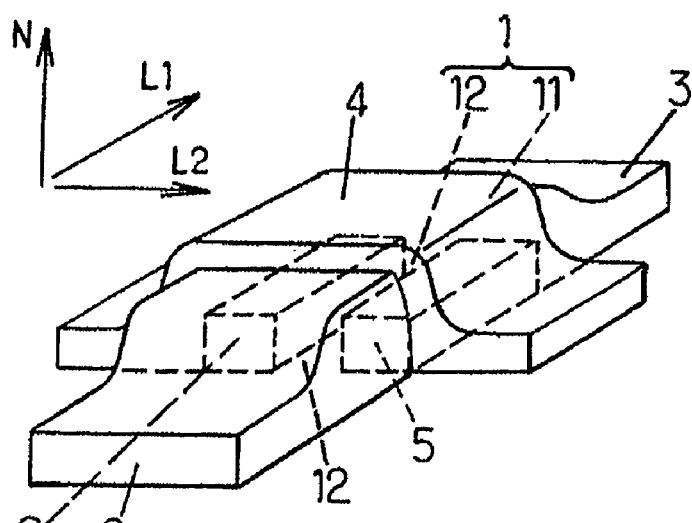

Other features and advantages of the present invention will become apparent from the description below of two nonlimiting exemplary embodiments, with reference to the appended drawings, in which, FIGS. 1 to 8 illustrate various steps of a method of making a transistor structure according to the invention;

FIG. 9 shows in a simplified manner the transistor structure obtained; and

Figure 10A:
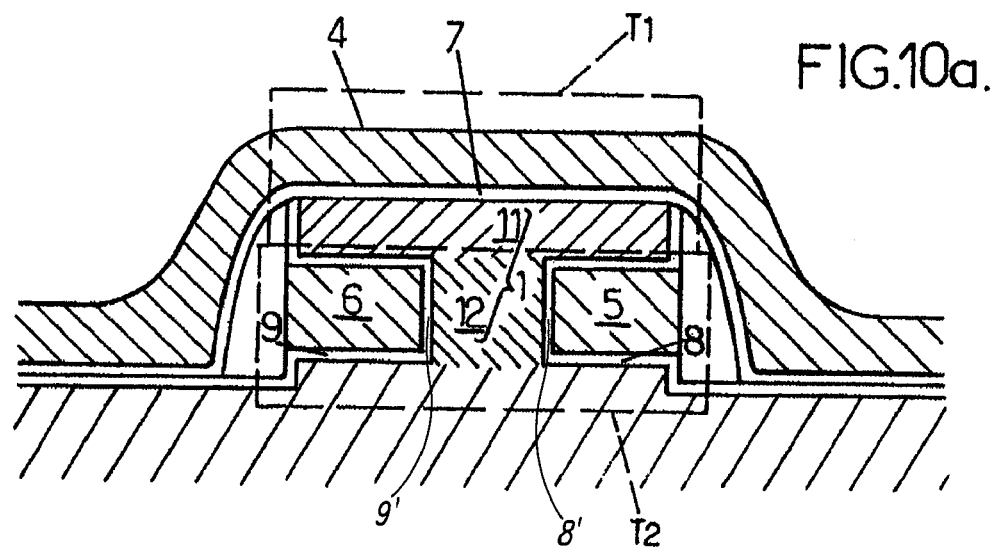
Figure 10B:
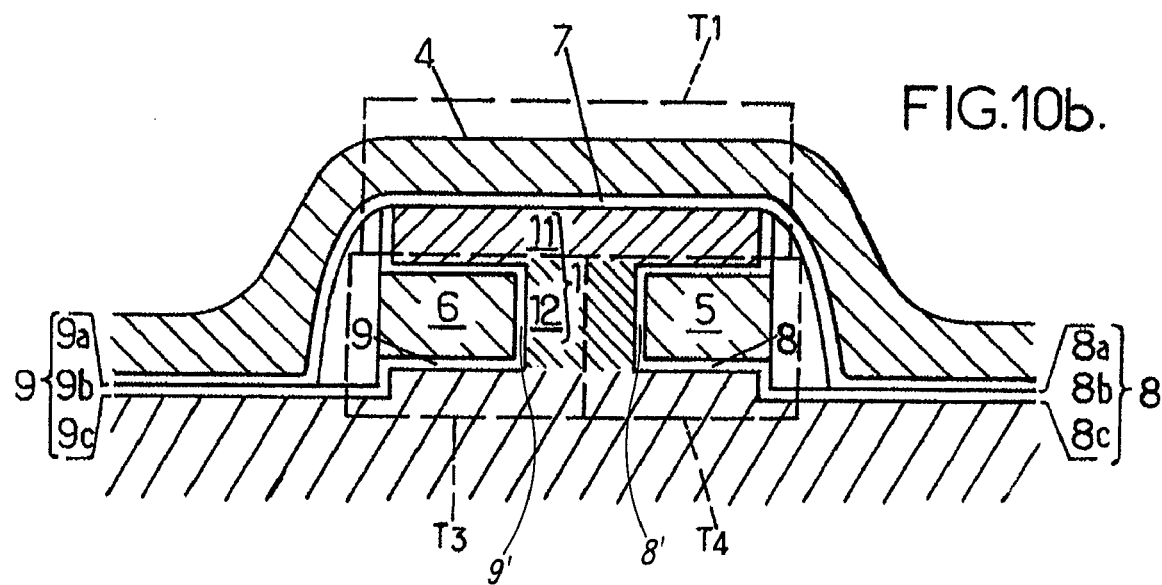

FIGS. 10*a* and 10*b* illustrate two possible uses of the transistor structure of FIG. 9.

DETAILED DESCRIPTION OF THE INVENTION

For the sake of clarity, the dimensions of the elements represented in these figures are not in proportion to their actual dimensions. We denote by N a direction perpendicular to the surface of a substantially flat substrate used to make the structure. The direction N is oriented upwards in the figures, and the words "on", "under", "lower" and "upper" used in the description are so with reference to this orientation. Furthermore, identical references on various figures denote elements that are identical or that have identical functions. L1 and L2 denote two directions parallel to the surface of the substrate, called the longitudinal direction and transverse direction respectively.

Figure 2:
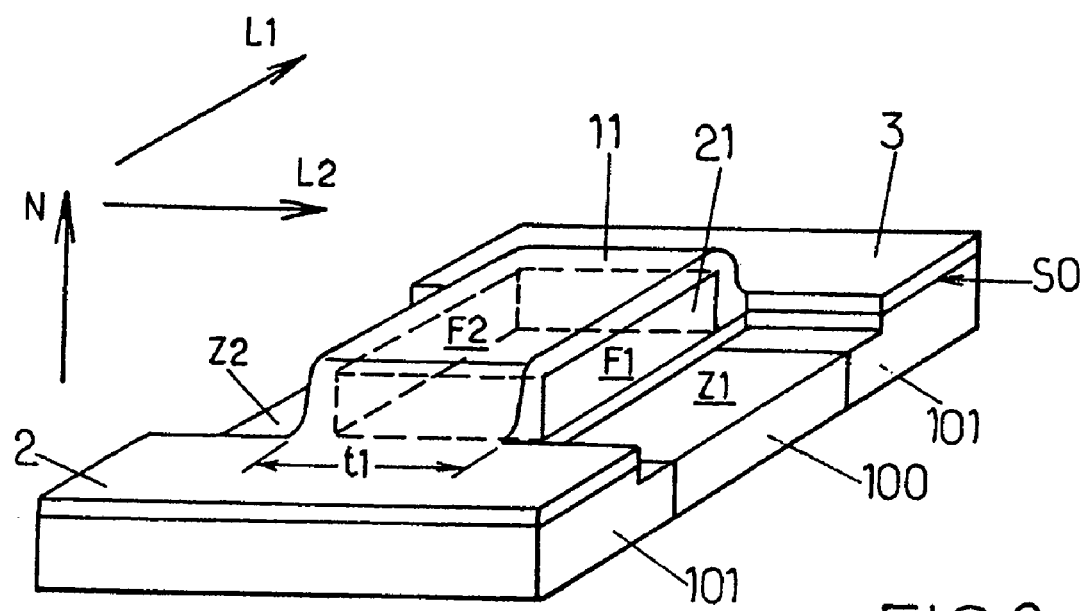
Figure 3:
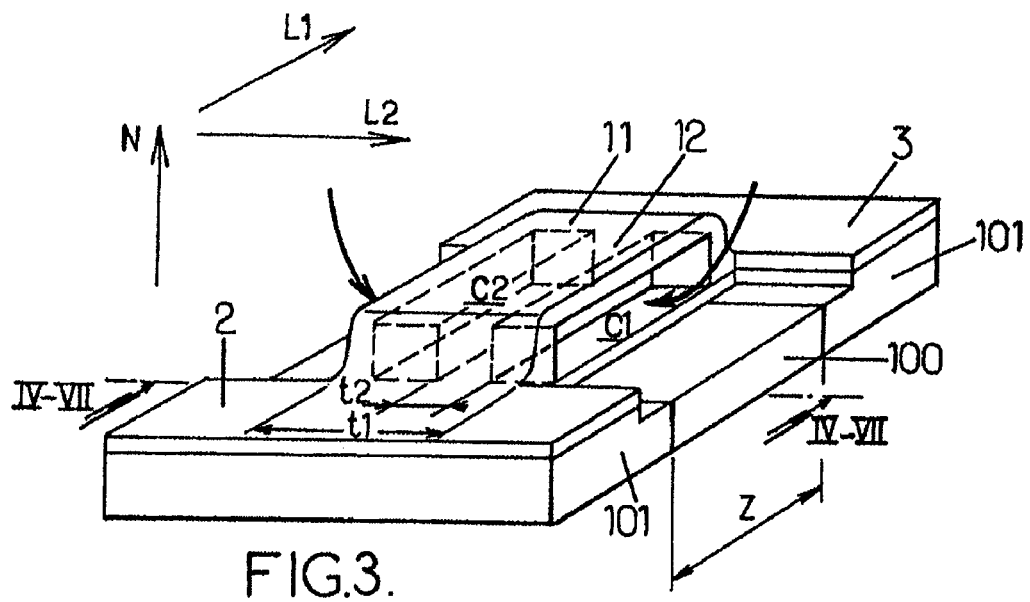

FIGS. 1-3, 8 and 9 are perspective views of the transistor structure during fabrication, and FIGS. 4-7 are sectional views through a plane parallel to the directions N and L2 indicated in FIG. 3.

Finally, in the description we limit ourselves to describing a succession of elementary steps for making an integrated electronic circuit, which makes it possible to reproduce the invention. Each elementary step, which is considered to be known per se, is not given in detail.

In accordance with FIG. 1, an integrated electronic circuit substrate undergoing fabrication comprises a monocrystalline silicon base 100. An electrical insulation zone 101, for example made of silica ($SiO_2$) and of the STI type (standing for "shallow trench isolation"), has been formed in the base 100 around a zone Z of the latter intended to carry the transistor structure. The zone Z may be called an active zone of the substrate. The length of the zone Z in the direction L1 may be 200 nanometers, for example. The zone 101 is intended to electrically insulate the transistor structure with respect to other electronic components that may be made on the same substrate. Two parts of the zone 101 are visible in FIG. 1, on each side of the zone Z in the longitudinal direction L1.

The substrate furthermore comprises a portion 21 formed on the upper surface S0 of the base 100 in the zone Z. The portion 21 may be made of a substantially monocrystalline silicon and germanium alloy. In a known manner, it may be obtained by epitaxial growth of the alloy from the surface S0 of the base 100 in the zone Z.

Finally, the substrate is covered with a conformal silicon layer 20 which extends over the portion of alloy 21 in the zone Z and over the insulation zone 101 around the zone Z. The layer 20 may be formed by deposition of silicon under conditions suitable for obtaining epitaxial growth from the portion of alloy 21. The layer 20 is then substantially monocrystalline above the portion of alloy 21, and polycrystalline above the insulation zone 101.

The circuit is etched in two lateral zones Z1 and Z2 separated in the transverse direction L2. Preferably, a directional plasma etching method is used, which is commonly denoted directional dry etching. To do this, a mask (not represented) is formed on the circuit outside of the zones Z1 and Z2, for example by photolithography, and plasma particles are accelerated against the upper surface of the circuit, parallel to the direction N and in the opposite sense to the latter. The duration of etching is adjusted in such a way that two etching fronts substantially parallel to the surface S0 cross the layer 20 and the portion 21 respectively in the zones Z1 and Z2, then reach the surface S0 of the base 100 of the substrate. Optionally, the zones Z1 and Z2 may have a length in the longitudinal direction L1 identical to that of the zone Z. The separation distance between the zones Z1 and Z2, in the transverse direction L2, is denoted $t_1$. It may be 500 nanometers, for example. Two lateral faces F1 and F2 of the alloy portion 21 are formed during etching, so that the silicon and germanium alloy of the portion 21 is uncovered at the level of the faces F1 and F2. The lateral faces F1 and F2 are parallel to the directions N and L1, and are situated on each side, in the direction L2, of a residual part of the portion 21. The etching mask is removed. FIG. 2 illustrates the circuit configuration which is obtained. The layer 20 now comprises three distinct parts: a part 11 situated between the zones Z1 and Z2 forming a bridge above the residual part of the alloy portion 21, and two parts 2 and 3 situated at the ends of the part 11 in the longitudinal direction L1, on the insulation zone 101.

Figure 4:
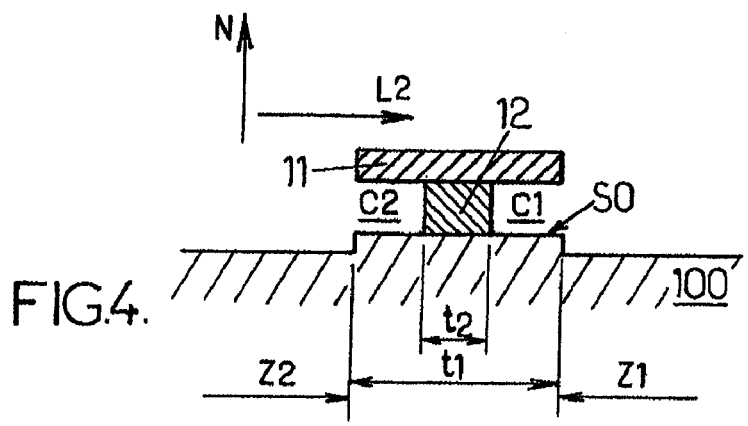

The circuit is next placed in contact with a fluid for selective etching of the silicon and germanium alloy. Such an etching method is well known, and makes it possible to obtain selective and isotropic etching. The silicon materials of the layer 20 and of the base 100, as well as the silica material of the zone 101, are not impaired by the etching fluid. The etching fluid is in contact with the silicon and germanium alloy on the lateral faces F1 and F2. Two symmetric etching fronts, parallel to the directions N and L1, progressively penetrate the portion 21, on each side of the latter in the direction L2. In FIG. 3, the two arrows indicate the directions of etching of each side of the portion 21. This selective and isotropic etching is continued for a duration determined in such a way that the two fronts advance under the part 11 of the layer 20 until they are separated from one another by a distance $t_2$ measured parallel to the direction L2. The distance $t_2$ may lie between 100 and 200 nanometers, for example. Two cavities C1, C2 are thus formed between the part 11 and the base 100 in the direction N, on each side of a residual part 12 of the alloy portion 21. The alloy part 12 is centered, in the direction L2, with respect to the silicon part 11. The widths of the parts 11 and 12 in the transverse direction L2 are therefore equal to $t_1$ and $t_2$, respectively. FIG. 4 clearly depicts the relative positions of the parts 11 and 12 of the cavities C1 and C2.

Figure 5:
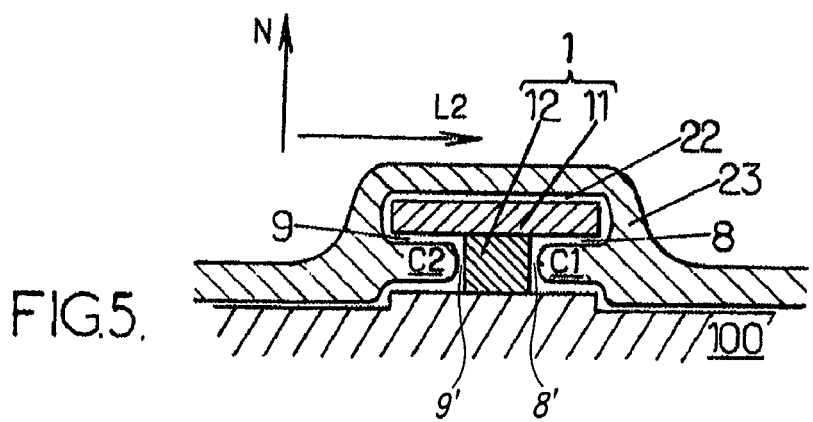
Figure 6:
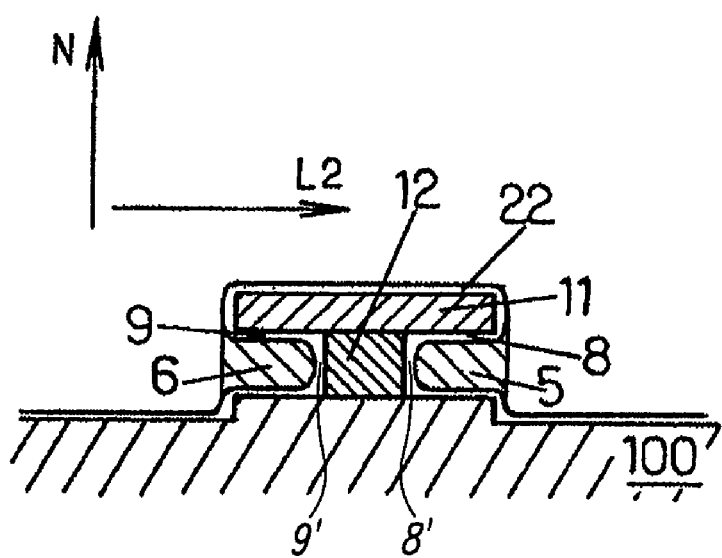

A continuous and electrically insulating layer 22 is then formed on the circuit as a whole. The layer 22 covers in particular the uncovered faces of the silicon base 100 of the silicon part 11 and of the silicon and germanium alloy part 12 (FIG. 5). The layer 22 may be formed by isotropic deposition of an insulating material, such as silica ($SiO_2$) or a compound of silicon oxynitride type (SiON). Alternatively, the layer 22 may be formed by surface oxidation of the base 100 and of the parts 11 and 12 when the circuit is placed in contact with an oxidizing and heated fluid. Such a method is known by the name RTA standing for "rapid thermal annealing". In this case, the layer 22 covers only the uncovered faces of the base 100 and of the parts 11 and 12. The thickness of the layer 22 may be, for example, between 1 and 2 nanometers. Portions 8, 8',9, and 9' of the layer 22 cover the base 100 and the parts 11 and 12 inside the cavities C1 and C2.

A conducting material 23 is then deposited, in isotropic fashion, on the circuit so as to fill the cavities C1 and C2 and to cover the part 11 as well as the base 100. In particular, a method of low-pressure deposition, for example chemical vapor deposition or CVD, is suitable for obtaining dense and homogeneous filling of the cavities C1 and C2. The conducting material 23 may be polysilicon, an elemental metal or a metallic compound such as titanium nitride (TiN), in particular.

The material 23 is etched with a plasma accelerated parallel to the direction N and in the opposite sense to the latter, so as to remove exposed portions of the material 23. The material portions 23 situated above the zones 101, Z1 and Z2, as well as a material portion 23 situated above the part 11, are eliminated. On completion of this directional etching step, only the material portions 23 that are sheltered because they are situated in the cavities C1 and C2 under the part 11 remain. These residual portions are referenced 5 and 6 in FIG. 6.

A spacer 102 (FIG. 7) is formed next, for example by implementing the method of making a MOS transistor gate spacer. The spacer 102 closes the cavities C1 and C2 filled by the portions 5 and 6, on two of their external lateral sides. It may be made of silicon nitride ($Si_3N_4$), for example. When the upper surfaces of the parts 2 and 3 on the one hand, and of the part 11 on the other hand, are situated substantially at one and the same height in the direction N, the spacer 102 need only be present on the external lateral sides of the portions 5 and 6. Specifically, the known method of fabricating a spacer by MOS technology comprises a step of removing spacer parts which are formed on surfaces substantially parallel to the surface of the substrate. By using such a method, a part of the spacer 102, which part is formed initially on the parts 2, 3 and 11, as well as on the boundaries between these parts, may ultimately be removed. Such a configuration may be obtained, in particular, when conditions of growth of the layer 20 are adopted, so that the polycrystalline silicon is formed more rapidly in the parts 2 and 3 above the zone 101, by comparison with the rate of formation of the monocrystalline silicon above the portion 21.

Figure 7:
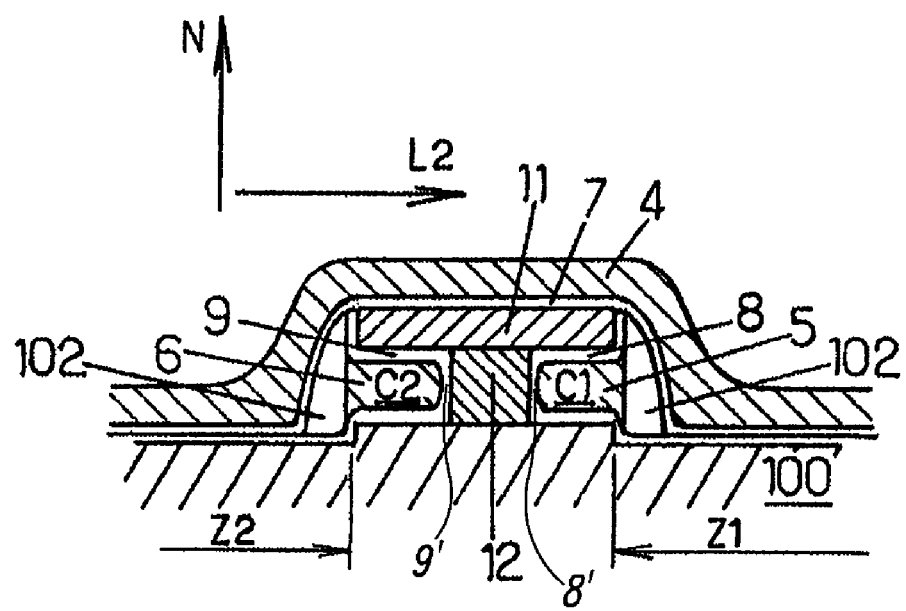

The inventors have found that the portion of the insulating layer 22 situated above the part 11 is eliminated during the making of the spacer 102. A new electrical insulation layer is then formed on the circuit, which may be continuous and which comprises an upper portion 7 situated on the part 11, in place of the portion of the layer 22 situated at the same location (FIG. 7).

Figure 8:
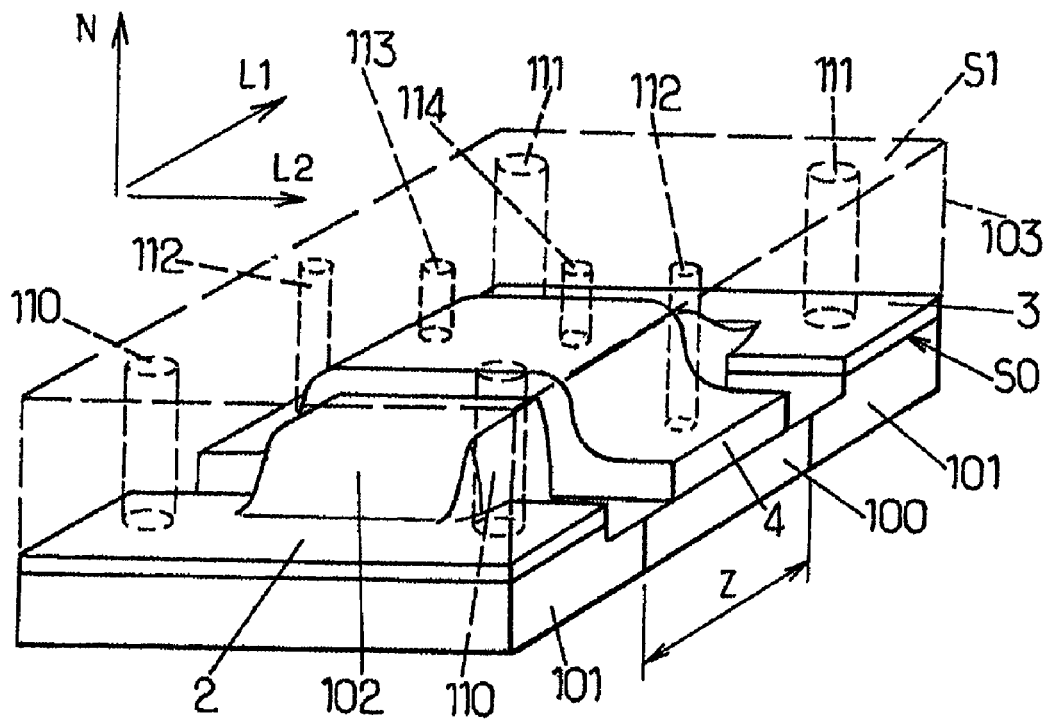

A portion 4 of conducting material is formed on the circuit, in the form of a band parallel to the direction L2, which extends above the part 11 and in the zones Z1 and Z2. The portion 4 may have a width, in the direction L1, which is substantially identical to that of the zone Z (FIG. 8). Alternatively, the width of the portion 4 may be less than that of the zone Z, in the direction L1, in particular when this width is determined by a gates mask. The material of the portion 4 may be identical to that of the portions 5 and 6.

The making of the circuit is continued in the same way as that of a conventional circuit with MOS transistors, after the transistors have been finished. A premetallization layer 103 is deposited on the circuit, so as to enshroud the whole of the structure comprising the part 11, the portions 2, 3 and 4, and the spacer 102 in particular. The layer 103 may be made of silica. It is polished so as to endow it with a plane upper surface S1.

Finally, electrical connections are formed through the layer 103, so as to electrically connect the various semiconducting or conducting elements of the structure (FIG. 8). Connections 110 and 111 respectively connect the parts 2 and 3, connections 112 connect the portion 4 and connections 113 and 114 respectively connect the portions 5 and 6. The connections 113 and 114 pass through the layer 103 and the portion 4, while being electrically insulated from the latter. To do this, chimneys are firstly etched between the surface S1 and the portions 5 and 6, then the circuit is exposed to an oxidizing fluid so as to form insulating walls inside the chimneys in the portion 4. Bottoms of the chimneys are again etched directionally so as to remove insulating films therefrom, then the chimneys are filled with conducting material.

FIG. 9 recalls the principal conducting or semiconducting elements of the structure made, so as to clearly show their arrangement. The base 100 of the substrate, the insulation zone 101, the portions of insulating layers 7-9, the spacer 102, the layer 103 and the electrical connections 110-114 have not been represented in this figure.

The part 11, made of silicon devoid of germanium, and the part 12, made of silicon and germanium alloy, are connected together along a length parallel to the direction L1. The part 12 is situated between the substrate and the part 11. Together they form a single semiconductor element, referenced 1, which extends between the parts 2 and 3 of the structure. The parts 11 and 12 are said to be first and second parts of the element 1, respectively. In the structure described here by way of example, the semiconductor element 1 has a T-shaped transverse section in a plane perpendicular to the longitudinal direction L1. The longitudinal direction L1 of the element 1 is parallel to the surface S0 of the substrate which carries the structure. Furthermore, on account of their respective positions relative to the T-shape of the element 1, the portion 4 is called the upper conducting portion, and the portions 5 and 6 are called the lower conducting portions.

The spacer 102, which is not represented in FIG. 9 for the sake of clarity, electrically insulates the portions 5 and 6 from the portion 4.

Three possible uses of this structure are now described. In these three uses, the parts 2 and 3 are respectively source and drain zones of transistors included in the structure.

According to a first use of the structure, the three portions 4, 5 and 6 constitute a triple gate for controlling the state of conduction of a single transistor included in the structure. The element 1 constitutes the channel zone of the transistor, between the source zone 2 and the drain zone 3. The triple-gate transistor structure thus obtained affords especially accurate control of the state of conduction of the transistor.

In particular, thanks to the T-shaped cross-section of element 1 which makes it possible to have parts 11 and 12 each with reduced thickness, a bulk-type electrical conduction may be obtained in the channel-forming element 1 when electronic inversion is created in this element. Such bulk-type conduction enables to have an electrical current which is more important flowing between the source zone 2 and the drain zone 3, although the transistor structure is compact with limited size, and compatible with a high integration level.

According to a second use of the structure illustrated by FIG. 10a, the part 11 forms together with the portion of insulating layer 7 and the portion 4 a first MOS transistor, denoted T1. The portion 4 is a portion of gate for the transistor T1, and the portion 7 is said to be the upper portion of insulating layer, or upper gate insulation layer. When the transistor T1 is on, a conduction channel is formed in the part 11, in proximity to the layer 7. The part 12 forms, together with the insulating layer portions 8 and 9 and the portions 5 and 6, a second MOS transistor, denoted T2, with two independent gates. The two gates correspond respectively to the conducting portions 5 and 6, and are insulated from the part 12 by the portions of insulating layer 8 and 9, termed the lower portions of insulating layer or lower gate insulation layers. The part 12 constitutes the body of the transistor T2, and a conduction channel is formed in the part 12 when the transistor T2 is on. The source zone 2 and drain zone 3 are shared between the transistors T1 and T2. For this second use of the structure, the insulating layer 22 from which the portions 8 and 9 originate is preferably a simple layer of oxide material.

In such second use of a transistor structure according to the invention, parts 11 and 12 each form a respective channel part, the conduction state of which can be controlled independently by means of gate portions 4 or 5,6. Indeed, because of the T-shaped cross-section of element 1, few interactions occur between parts 11 and 12. The structure is then equivalent to two transistors, corresponding to T1 and T2, which are connected in parallel between common source and drain zones, with separate respective gates. The transistors T1 and T2 may be used for distinct respective functions within a circuit which comprises the transistor structure. Such two-function use of the transistor structure is made possible because element 1 has a T-shaped cross-section.

The two gates of the transistor T2 being independent, they may be taken to different respective electrical potentials. The part 12 then exhibits a floating electrical potential. Such a transistor T2 may be used as a random access memory cell, of the volatile memory type, to store a bit. The manner of operation of such a random access memory cell with a single transistor was mentioned above and is not recalled here.

According to a third use of the structure illustrated by FIG. 10b, the insulating layer 22 consists of a stack of three elementary layers: an elementary layer of a nitride material sandwiched between two elementary layers of oxide materials. The nitride material may be a silicon nitride, of SiN type, and the oxide materials may be silicon oxides, of SiO type. The portion 8 then consists of three portions of elementary layers 8a, 8b and 8c, respectively made of oxide, nitride and oxide. The part 12, the conducting portion 5 and the portion 8 then constitute a MOS transistor denoted T3, which is suitable for containing an electric charge in the stack of the three portions of elementary layers 8a, 8b and 8c. When the transistor T3 is on, a channel is formed in the part 12 in proximity to the portions of layers 8a, 8b and 8c. In a known manner, such a transistor T3 may be used as a random access memory cell, of the permanent memory type, to store a bit.

Likewise, the portion 9 consists of three portions of elementary layers 9a, 9b and 9c respectively symmetric with respect to the portions 8a, 8b and 8c. The part 12, the conducting portion 6 and the portion 9 then constitute another MOS transistor denoted T4, which is identical to the transistor T3. The transistor T4 may therefore be used as another random access memory cell, of permanent memory type, to store a bit. Although the part 12 is shared between the transistors T3 and T4, the two memory cells corresponding respectively to the transistors T3 and T4 are independent.

In this third use of the structure, the part 11 of the semiconductor element 1, the portion of insulating layer 7 and the gate portion 4 together form a first MOS transistor T1, which is identical to that described in respect to the second use. This transistor T1 possesses a manner of operation independent of those of the transistors T3 and T4.

In the second and third uses of the transistor structure which have been described, the transistor T1 may have any function whatsoever. This function may be tied to those of the transistors T2, T3 or T4, or be independent of their functions. For example, the transistor T1 may constitute a part of a logic operator. Alternatively, it may have an analog function.

It is of course understood that numerous modifications may be introduced during an embodiment of the invention, with respect to the detailed description above, while preserving some at least of the advantages afforded by the invention. In particular, mention may be made of the following possible modifications:

the orientation of the transistor structure with respect to the surface of the substrate may be changed. Thus, the transverse direction L2 which links the two gate portions 5 and 6 may be perpendicular to the surface of the substrate S0. Alternatively, the structure described may be inverted with respect to the substrate, so that the gate portion 4 becomes closer to the surface S0 than the gate portions 5 and 6 which are then situated above the part 11 of the element 1;

the two parts 11 and 12 of the semiconductor element 1 may be made of the same material, or be arranged differently while still making it possible to dispose the three gate portions 4, 5 and 6 around the element 1;

the width $t_1$ of the part 11 of the element 1 may be determined in various ways. In particular, it may result from a dimension of another element of the structure, which other element is made before the part 11, or may be defined by a specific lithography mask; and insulating materials with high dielectric permittivity may be used for the gate insulation layers 7, 8 and 9.

Furthermore, a transistor structure according to the invention may be made whatever MOS transistor technology is used, characterized by the minimum gate length which is obtained with this technology.

Finally, the functions of each transistor of the structure within an electronic circuit are not limited to those which were mentioned above by way of examples.

The invention claimed is:

1. A transistor structure comprising:
   a semiconductor element extending in a longitudinal direction between a source zone and a drain zone, said element comprising a first part and a second part each connecting the source and drain zones, the first part having first and second sides that are opposite to one another, the second part being connected to the first side of the first part over a length between the source and drain zones;
   a first gate portion situated on the second side of the first part of the semiconductor element;
   second and third gate portions that are situated respectively on two opposite sides of the second part of the semiconductor element, in a direction perpendicular to the longitudinal direction; and
   first, second and third electrical insulation layers, respectively situated between the semiconductor element and the first, second and third gate portions, wherein the second part of the semiconductor element is connected to the first part of said element so that a transverse section of said element in a plane perpendicular to the longitudinal direction possesses a T shape.

2. A transistor structure according to claim 1, wherein the longitudinal direction of the semiconductor element is parallel to a surface of a substrate carrying the structure.

3. A transistor structure according to claim 2, wherein the second part of the semiconductor element is situated between the substrate and the first part of said element.

4. A transistor structure according to claim 1, wherein the second and third electrical insulation layers are each made of an oxide material.

5. A transistor structure according to claim 1, wherein the second and third electrical insulation layers each comprise a stack of three elementary layers, each stack comprising an elementary layer of a nitride material situated between two elementary layers of oxide materials.

6. The transistor structure of claim 1, wherein the first part of semiconductor element is made of a different semiconductor material than the second part of the semiconductor element.

7. The transistor structure of claim 1, further comprising:
   a fourth electrical insulation layer electrically insulating the first gate portion from the second gate portion; and
   a fifth electrical insulation layer electrically insulating the first gate portion from the third gate portion.

8. A random access memory cell, comprising:
   a semiconductor element extending in a longitudinal direction between a source zone and a drain zone, said element comprising a first part and a second part each connecting the source and drain zones, the first part having first and second sides that are opposite to one another, the second part being connected to the first side of the first part over a length between the source and drain zones;
   a first gate portion situated on the second side of the first part of the semiconductor element;
   second and third gate portions that are situated respectively on two opposite sides of the second part of the semiconductor element, in a direction perpendicular to the longitudinal direction; and
   first, second and third electrical insulation layers, respectively situated between the semiconductor element and the first, second and third gate portions, wherein a first bit is stored in a first transistor having a source formed by the source zone, a drain formed by the drain zone, and a gate formed by at least one of the gate portions, wherein the second part of the semiconductor element is connected to the first part of said element so that a transverse section of said element in a plane perpendicular to the longitudinal direction possesses a T shape.

9. The memory cell according to claim 8, wherein the gate of the first transistor is the second gate portion and a second bit is stored in a second transistor having a source formed by the source zone, a drain formed by the drain zone, and a gate formed by the third gate portion.

10. The memory cell according to claim 9, wherein the second and third electrical insulation layers each comprise a stack of three elementary layers, each stack comprising an elementary layer of a nitride material situated between two elementary layers of oxide materials, wherein the first and second transistors store the first and second bits, respectively, as electrical charges in the nitride materials of the second and third electrical insulation layers, respectively.

11. The memory cell according to claim 8, wherein the longitudinal direction of the semiconductor element is parallel to a surface of a substrate carrying the structure.

12. The memory cell according to claim 11, wherein the second part of the semiconductor element is situated between the substrate and the first part of said element.

13. The memory cell according to claim 8, wherein the second and third electrical insulation layers are each made of an oxide material.

14. The memory cell of claim 8, wherein the first part of semiconductor element is made of a different semiconductor material than the second part of the semiconductor element.

15. The memory cell of claim 8, further comprising:
   a fourth electrical insulation layer electrically insulating the first gate portion from the second gate portion; and
   a fifth electrical insulation layer electrically insulating the first gate portion from the third gate portion.

16. A transistor structure comprising:
   a first semiconductor element extending in a longitudinal direction between a source zone and a drain zone;
   a first insulation portion positioned on a first side of the first semiconductor element;
   a first gate portion positioned on the first insulation portion and insulated from the first semiconductor element by the first insulation portion;
   a second insulation portion positioned on a second side of the first semiconductor element, the second side being opposite to the first side;
   a second gate portion positioned on the second insulation portion and insulated from the second side of the first semiconductor element by the second insulation portion;
   a third insulation portion that insulates the second gate portion from the first gate portion;
   a fourth insulation portion positioned on the second side of the first semiconductor element;
   a third gate portion positioned on the fourth insulation portion and insulated from the second side of the first semiconductor element by the fourth insulation portion; and a fifth insulation portion that insulates the third gate portion from the first gate portion; and a sixth insulation portion positioned between the second and third gate portions.

17. The transistor structure of claim 16 wherein the first side is a top side of the semiconductor element and the second side is a bottom side of the semiconductor element.

18. The transistor structure of claim 16, further comprising a second semiconductor element extending in the longitudinal direction between the source zone and the drain zone, the second semiconductor element contacting the second side of the first semiconductor element and being positioned between the second and third gate portions.

19. The transistor structure of claim 18, wherein the first and second semiconductor elements form a T-shaped structure.

20. The transistor structure of claim 18, wherein the first semiconductor element is made of a different semiconductor material than the second semiconductor element.

21. The transistor structure of claim 16, further comprising a semiconductor substrate having a surface parallel to the longitudinal direction of the first semiconductor element, the first semiconductor element being supported by and coupled to the substrate.

22. The transistor structure of claim 16, further comprising:

a semiconductor substrate having a surface parallel to the longitudinal direction of the first semiconductor element; and a second semiconductor element extending in the longitudinal direction between the source zone and the drain zone, the second semiconductor element contacting the second side of the first semiconductor element and being positioned between the second and third gate portions, wherein the first semiconductor element is coupled to the substrate by the second semiconductor element.

23. The transistor structure of claim 16, wherein the second, fourth, and sixth insulation portions are made of a first insulating material and the third and sixth insulation portions are made of a second insulating material.

24. The transistor structure of claim 16, wherein the second, fourth, and sixth insulation portions each comprise a stack of three elementary layers, each stack comprising an elementary layer of a nitride material situated between two elementary layers of oxide materials.

* * * * *